United States Patent
Han et al.

(10) Patent No.: US 10,727,325 B1
(45) Date of Patent: Jul. 28, 2020

(54) NANOSTRUCTURE-BASED VACUUM CHANNEL TRANSISTOR

(71) Applicant: UNITED STATES OF AMERICA AS REPRESENTED BY THE ADMINISTRATOR OF NASA, Washington, DC (US)

(72) Inventors: Jin-Woo Han, San Jose, CA (US); Meyya Meyyappan, San Jose, CA (US)

(73) Assignee: United States of America as Represented by the Administrator of NASA, Washington, DC (US)

( * ) Notice: Subject to any disclaimer, the term of this patent is extended or adjusted under 35 U.S.C. 154(b) by 0 days.

(21) Appl. No.: 15/933,240

(22) Filed: Mar. 22, 2018

(51) Int. Cl.
*H01L 29/66* (2006.01)
*H01L 29/739* (2006.01)
(Continued)

(52) U.S. Cl.
CPC ...... *H01L 29/7394* (2013.01); *H01L 29/0665* (2013.01); *H01L 29/1033* (2013.01);
(Continued)

(58) Field of Classification Search
CPC ............. H01L 21/8222; H01L 21/8248; H01L 21/8249; H01L 27/0259; H01L 27/0623; H01L 27/0635; H01L 27/0647–067; H01L 27/0711–0722; H01L 27/075–0783; H01L 27/082–0828; H01L 27/1022–1026; H01L 27/11801; H01L 27/11896; H01L 27/14681; H01L 29/04–045; H01L 29/0804–0817;
(Continued)

(56) References Cited

U.S. PATENT DOCUMENTS

| | | | | |
|---|---|---|---|---|
| 5,012,153 A | * | 4/1991 | Atkinson | H01J 3/022 313/309 |
| 5,389,796 A | * | 2/1995 | Kang | H01J 1/34 257/10 |

(Continued)

OTHER PUBLICATIONS

Vacuum channel transistor combines best of semiconductors and vacuum tubes (Apr. 4, 2017) (Year: 2017).*

(Continued)

*Primary Examiner* — Jarrett J Stark
(74) *Attorney, Agent, or Firm* — Rhys W. Cheung; Robert M. Padilla; Helen M. Galus

(57) ABSTRACT

A horizontal vacuum channel transistor is provided. The horizontal transistor includes a substrate, horizontal emitter and collector electrodes formed in a layer of semiconductor material of the substrate, and a horizontal insulated gate located between the emitter and collector electrodes. The emitter electrode includes multiple horizontally-aligned emitter tips connected to a planar common portion, and the collector electrode includes a planar portion. The gate includes multiple horizontally-aligned gate apertures passing through the gate that each correspond to one of the emitter tips of the emitter electrode. The minimum distance between the emitter and collector electrodes is less than about 180 nm. Also provided are a vertical vacuum channel transistor having vertically-stacked emitter and collector electrodes, and methods for fabricating vacuum channel transistors.

19 Claims, 5 Drawing Sheets

Cross-Sectional View

Top View

(51) Int. Cl.
H01L 29/417 (2006.01)
H01L 29/06 (2006.01)
H01L 29/10 (2006.01)

(52) U.S. Cl.
CPC .. H01L 29/41708 (2013.01); H01L 29/66325 (2013.01); *H01L 29/66439* (2013.01)

(58) Field of Classification Search
CPC ..... H01L 29/0821–0826; H01L 29/083–0839; H01L 29/1004–1008
See application file for complete search history.

(56) References Cited

U.S. PATENT DOCUMENTS

| | | | | |
|---|---|---|---|---|
| 6,437,360 B1* | 8/2002 | Cho | ........................ | H01J 1/316 257/10 |
| 8,115,207 B2* | 2/2012 | Kim | ........................ | H01J 21/10 257/66 |
| 8,159,119 B2* | 4/2012 | Kim | ........................ | H01J 21/10 313/311 |
| 9,147,755 B1* | 9/2015 | Han | .................. | H01L 29/66977 |
| 9,715,987 B2* | 7/2017 | Xiao | ........................ | H01J 9/385 |
| 9,793,395 B1* | 10/2017 | Liu | ........................ | H01L 29/7827 |
| 9,805,900 B1* | 10/2017 | Findley | .................. | B05D 1/005 |
| 9,972,637 B2* | 5/2018 | Xiao | .................. | H01L 27/11568 |
| 2009/0140626 A1* | 6/2009 | Kim | ........................ | H01J 21/10 313/306 |
| 2014/0332753 A1* | 11/2014 | Xiao | .................. | H01L 29/0665 257/12 |
| 2016/0257998 A1* | 9/2016 | Persing | ................ | C12Q 1/6883 |
| 2017/0062743 A1* | 3/2017 | Cao | ........................ | H01L 51/0558 |
| 2017/0092778 A1* | 3/2017 | Zhang | ............... | H01L 29/78642 |
| 2018/0286621 A1* | 10/2018 | Biegelsen | ................ | H01J 9/02 |

OTHER PUBLICATIONS

Journal of Vacuum Science & Technology B 34, 042201 (2016); https://doi.org/10.1116/1.4944687 (Year: 2016).*

Nano Lett.20171742146-2151Publication Date:Mar. 23, 2017 (Year: 2017).*

Han, Jin-Woo et al. "Nanoscale Vacuum Channel Transistor"; Proceedings of the 14th IEEE International Conference on Nanotechnology; Toronto, Canada; Aug. 18-21, 2014 (pp. 172-175).

* cited by examiner

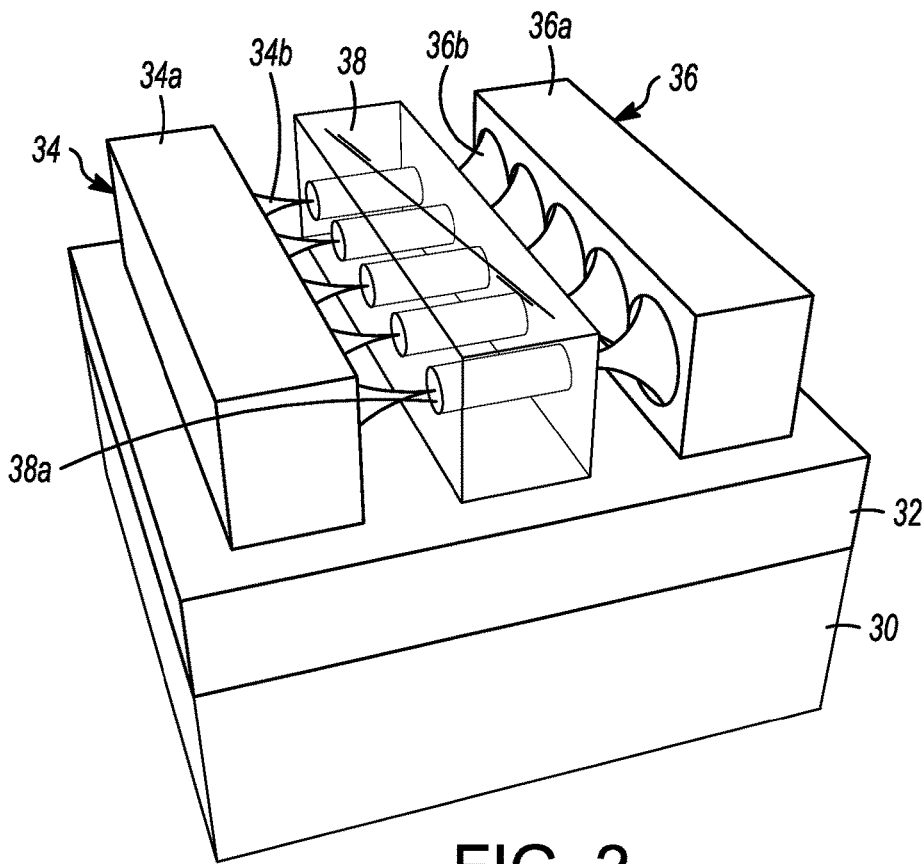
FIG. 2
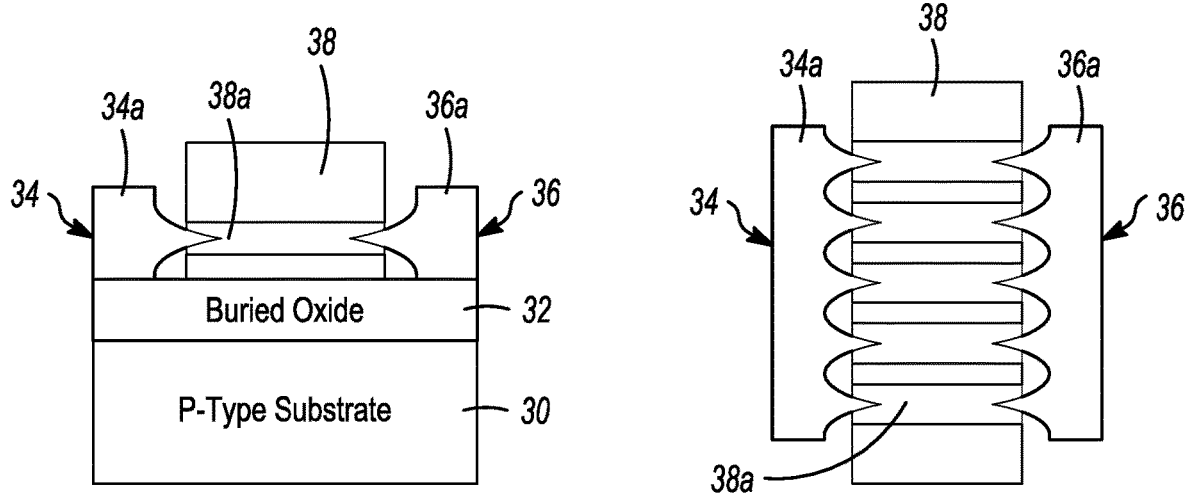
Cross-Sectional View
FIG. 3
Top View
FIG. 4

NANOSTRUCTURE-BASED VACUUM CHANNEL TRANSISTOR

ORIGIN OF THE INVENTION

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor has elected not to retain title.

FIELD OF THE INVENTION

The present invention generally relates to the field of semiconductors, and more specifically to a nanoscale transistor that uses a vacuum transport channel.

BACKGROUND OF THE INVENTION

Early electronics used vacuum tubes to amplify, switch, and modulate electrical signals. Many decades ago, most vacuum tubes were replaced by solid-state devices such as diodes and metal-oxide-semiconductor field-effect transistors (MOSFETs). The transition from vacuum tubes to solid-state devices was not driven by the superiority of the semiconductor as a carrier transport medium, but by the ease of fabrication, low cost, low power consumption, light weight, long lifetime, and ideal form factor of solid-state integrated circuits (ICs). While vacuum tubes were fabricated by mechanical machining and used as discrete components, modern solid-state devices are batch processed into integrated circuits. Additionally, cathodes of conventional vacuum tubes need to be heated for thermionic emission of electrons, and the energy for heating adversely overwhelms the energy required for field emission. A conventional vacuum device is, therefore, not suitable for low power applications.

However, a conventional solid-state semiconductor transistor does not perform well in extreme environments, such as very high temperature or where radiation is present. A vacuum device is more robust than a solid-state device in extreme environments involving high temperature and exposure to radiation. And for high power amplification (e.g., >50 W), a solid-state device requires a complex circuit architecture including many transistors, microstrips, and thermal management systems. A device that operates in a vacuum or near-vacuum offers immunity to radiation, increased robustness, and relatively high frequency, power input, and power amplification, but consumes more energy for similar performance. The critical tradeoff is that vacuum tubes yield higher frequency/power output but consume more energy than MOSFETs.

Transport in a vacuum is intrinsically superior to transport in a solid medium, because vacuum transport allows ballistic transport while solid-state carriers suffer from optical and acoustic phonon scattering in semiconductors. More specifically, charged particle carrier transport in a conventional solid-state transistor is dominated by a drift-diffusion mechanism, with an associated transport velocity limit of about $5\times10^7$ cm/sec (depending on the type of semiconductor used). Electrons are scattered and high temperature operation often results in a reduction of drive current. In contrast, electrons in a vacuum can move with few or no collisions (depending on the level of vacuum). A vacuum channel transistor, which relies upon thermionic emission and quantum tunneling, can operate ballistically for carrier transport, with a theoretical ballistic transport velocity of about $3\times10^{10}$ cm/sec.

SUMMARY OF THE INVENTION

One embodiment of the present invention provides a vacuum channel transistor that includes a substrate, a horizontal emitter electrode and a horizontal collector electrode formed in a layer of semiconductor material of the substrate, and a horizontal insulated gate located between the emitter and collector electrodes. The emitter electrode includes multiple horizontally-aligned emitter tips connected to a planar common portion, and the collector electrode includes a planar portion. The gate includes multiple horizontally-aligned gate apertures passing through the gate that each correspond to one of the emitter tips of the emitter electrode. The minimum distance between the emitter and collector electrodes is less than about 180 nm.

Another embodiment of the present invention provides a vacuum channel transistor that includes an emitter electrode formed of a first semiconductor material, a collector electrode formed of second semiconductor material, and an insulated gate located between the emitter and collector electrodes. The emitter electrode includes multiple vertically-stacked emitter tips connected to a planar common portion, and the collector electrode includes a planar portion. The gate includes multiple vertically-stacked gate apertures passing through the gate that each correspond to one of the emitter tips of the emitter electrode. The minimum distance between the emitter and collector electrodes is less than about 180 nm.

Yet another embodiment of the present invention provides a method for fabricating a vacuum channel transistor. According to the method, an emitter electrode that includes multiple emitter tips connected to a planar common portion is formed of a semiconductor material. A collector electrode that includes a planar portion is formed of the semiconductor material such that the minimum distance between the emitter and collector electrodes is less than about 180 nm. An insulated gate that includes multiple gate apertures passing through the gate and each corresponding to one of the emitter tips is formed between the emitter and collector electrodes.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 2 is a schematic view of a vacuum channel transistor according to one embodiment of the present invention;

FIG. 3 is a cross-sectional view of the vacuum channel transistor of FIG. 2;

FIG. 4 is a top view of the vacuum channel transistor of FIG. 2;

DETAILED DESCRIPTION

Figure 1:
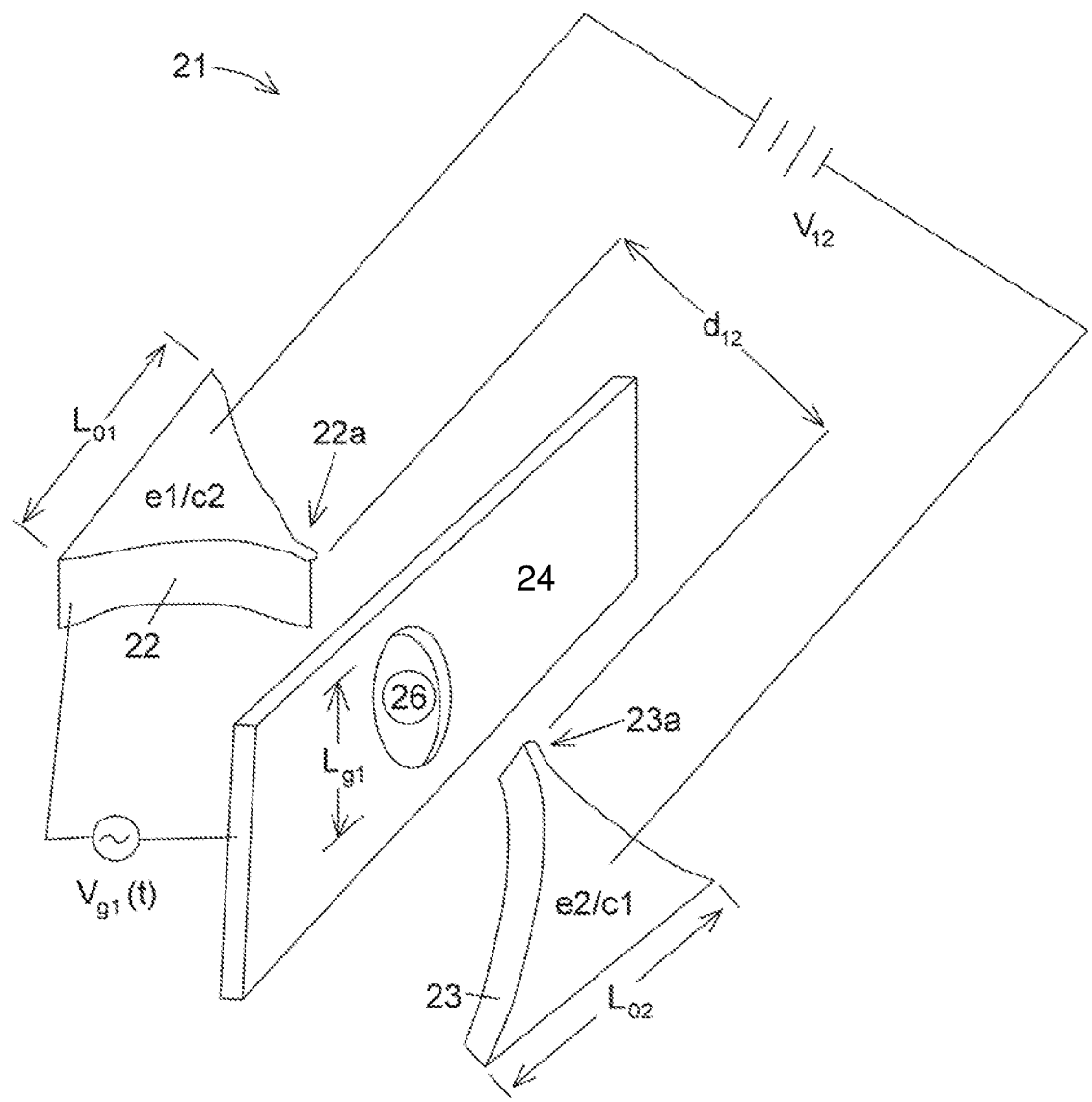
FIG. 1 is a schematic view of a vacuum channel transistor.
Figure 5A:
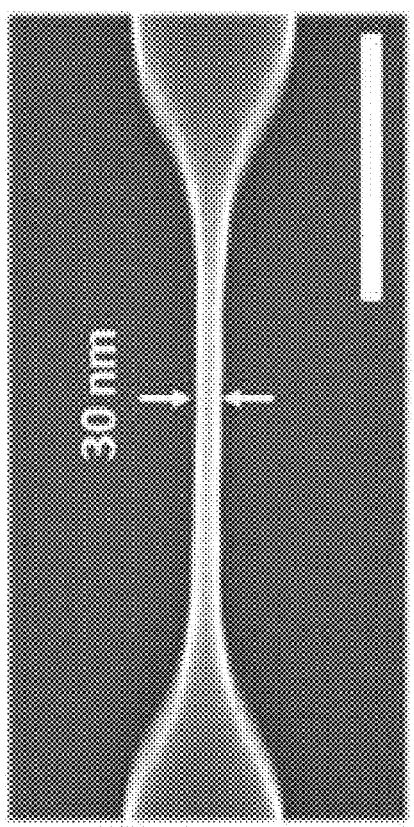
FIGS. 5A-5D are scanning electron microscopy images of a portion of a tip formation process.
Figure 5B:
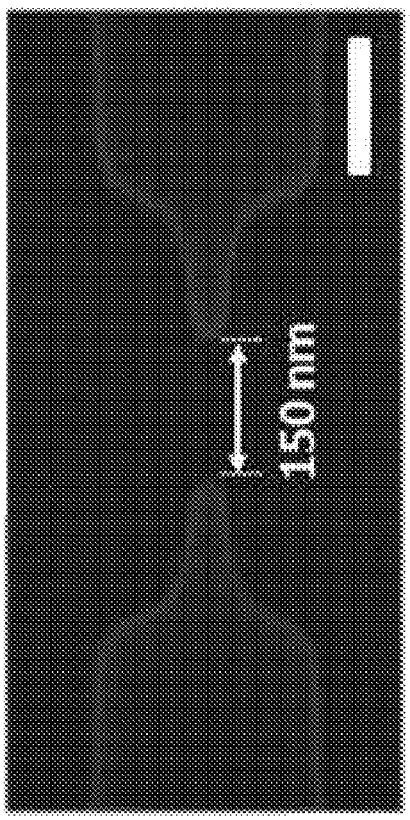
Figure 5C:
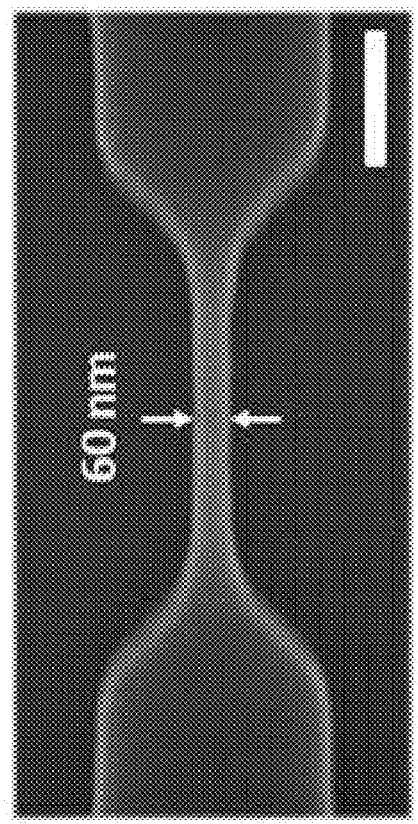
Figure 5D:
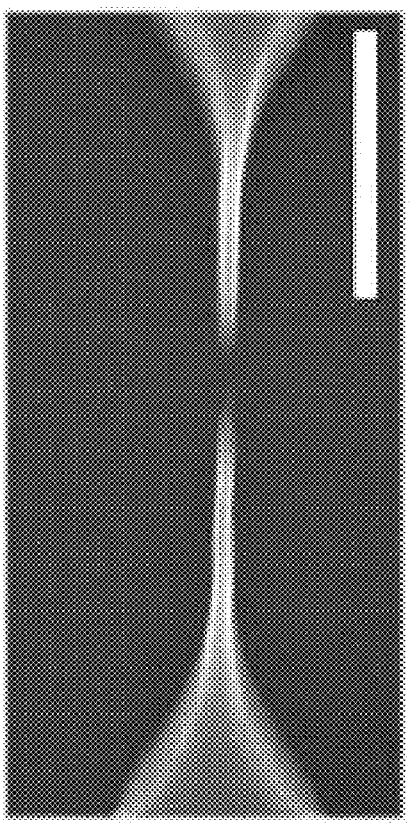

While the specification concludes with claims defining the features of the present invention that are regarded as novel, it is believed that the present invention will be better understood from a consideration of the following description in conjunction with the drawing figures, in which like reference numerals are carried forward. It is to be understood that the disclosed embodiments are merely exemplary of the present invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the present invention.

Embodiments of the present invention are directed to vacuum channel transistors that provide the operating advantages of vacuum devices while maintaining the cost advantage of silicon integrated circuit fabrication technology. The advantages of both vacuum devices and solid-state devices are achieved in a single device by miniaturizing the macroscale vacuum tube to a nanometer scale. A nanovacuum tube can provide high frequency/power output while satisfying the metrics of low mass, small size, reasonable cost, long lifetime, and stability in harsh environments. More importantly, further downscaling allows use of a cold cathode, because the electric field itself becomes strong enough to emit electrons. And a vacuum channel can operate ballistically for carrier transport by using smaller transport distances. Downscaling can also be combined with low work function materials to decrease the turn-on gate voltage and drain voltage to less than 1 volt. These benefits can be attained by using matured IC technology to fabricate nanoscale vacuum tubes and to facilitate circuit integration.

FIG. 1 schematically illustrates a vacuum channel transistor (VCFET). The transistor has cusp-shaped first and second electrodes 22 and 23. Cusp apices 22a and 23a of the electrodes are oriented toward an insulated gate 24 and are separated by an electrode-electrode separation distance $d_{12}$ that is less than the lithographic limit (e.g., presently about 180 nm). The gate 24 is a rectangular-shaped approximately planar surface positioned between the cusp apices 22a and 23a. At least one circular (or oval) gate aperture 26 is positioned in the planar surface such that a line of sight between the two cusp apices passes through the gate aperture. The diameter $L_{g1}$ of the gate aperture is preferably no more than about one half of the separation distance $d_{12}$. Alternatively, the gate 24 can be a cylindrical-shaped approximately planar surface with a circular (or more generally oval) aperture, as described in U.S. Pat. No. 9,147,755, which is herein incorporated by reference in its entirety.

The two electrodes 22 and 23 respectively operate as emitter and collector, or as collector and emitter. The movement of electrons between the emitter (cathode) and the collector (anode) of the transistor is controlled by the gate. In the illustrated example, there is an approximately constant voltage $V_{12}$ between the two electrodes 22 and 23, and a time variable voltage $V_{g1}(t)$ between the gate 24 and the first electrode 22. The transistor has a gate turn-on voltage as low as about 2 volts and can operate at a pressure of up to about 1 atmosphere (101 kPa).

Because the electrode-electrode separation distance $d_{12}$ is less than about 180 nm, the vacuum requirement is relaxed so that operation at atmospheric or near-atmospheric pressures is possible. Additionally, the turn-on voltage for field emission is reduced to a value that is less than the ionization energy of molecules in air (e.g., less than 2 volts). Therefore, this device can be referred to as a vacuum channel transistor even though it operates at atmospheric conditions.

In some embodiments, moderate vacuum packaging of about $10^{-3}$ Torr increases the robustness while still keeping the packaging cost low. In some embodiments, the electrodes and gate are operated in an inert gas atmosphere (e.g., Ne, Ar, Kr, Xe, and/or $N_2$) with a pressure of up to about 1 atmosphere or even higher.

In such a vacuum channel transistor, the current from the emitter is limited by the material type, its work function, and the size (e.g., radius of curvature) of the emitter tip. A vacuum channel transistor having an emitter electrode with multiple tips formed in parallel provides increased current, and thus increased power. FIGS. 2-4 illustrate a vacuum channel transistor according to one embodiment of the present invention. In this transistor, the emitter electrode has N emitter tips that each have a corresponding symmetrical collector tip on the collector electrode to produce a single transistor with N emitter-collector tip pairs. In this embodiment, the gate overlaps with both the emitter and collector tips 34b and 36b (and thus a portion of the emitter and collector electrodes). The length of the gate-tip overlap is about 10 nm to 50 nm (e.g., about 10, 20, 25, 30, 40, or 50 nm). Also in this embodiment, the tips of each electrode pair are separated by an electrode-electrode separation distance $d_{12}$ of about 180 nm or less, which is the lithographic limit.

In other embodiments, photoresist ashing or another technique is used to make the electrode-electrode separation distance $d_{12}$ less than the lithographic limit (e.g., less than about 150 nm, or less than about 125 nm). In still other embodiments, the electrode-electrode separation distance is less than about 100 nm, which is approximately the mean free path of electrons in air at a pressure of 1 atmosphere. In other embodiments, the electrode-electrode separation distance is less than about 50 nm, which produces desirable results with atmospheric pressure operation or at any vacuum level.

In further embodiments, the electrode-electrode separation distance is less than about 5 nm, 10 nm, 25 nm, or 45 nm, which smaller distances reduce the ionization of gas molecules. While collisions between electrons and gas molecules will be rare for separation distances less than or close to the mean free path of electrons in air at a pressure of 1 atmosphere so as to allow atmospheric pressure operation of the device, nominal vacuum conditions (for example, $10^{-3}$ Torr, $10^{-4}$ Torr, $10^{-5}$ Torr, or $10^{-6}$ Torr) can be used to virtually eliminate any collisions, and thus improve overall robustness and reliability of the device.

An exemplary process for fabricating this transistor will now be described. A silicon-on-insulator wafer is produced with a P-type substrate 30, an overlying buried oxide layer 32 (e.g., 100 nm), and an upper silicon layer (e.g., 120 nm). The use of a silicon-on-insulator (SOI) substrate reduces the leakage current through the bulk portion of the semiconductor wafer. While the off-state leakage current should be negligible in a vacuum channel device, the use of a bulk silicon substrate allows an off-state leakage current to flow through the bulk region of the substrate. This reverse biased PN junction current is the off-state leakage current and increases at higher temperatures. The off-state leakage current increases power consumption and in extreme cases can cause malfunction of the system. In an SOI substrate-based device, the emitter and collector are formed in the upper silicon layer, which is physically and electrically isolated by the buried oxide layer. Therefore, no PN junction is formed and the off-state leakage current is fundamentally inhibited. In alternative embodiments, the substrate is another semiconductor material on insulator, such as germanium-on-insulator, silicon carbide-on-insulator, or III-V-on-insulator. In other alternative embodiments, the substrate is formed of bulk Si, SiGe, SiC, III-V, wide-band gap, diamond, or any other semiconductor material.

To form the transistor, the upper silicon layer is first thinned (e.g., to 50 nm) by thermal oxidation and removal. The upper silicon layer is then degenerately doped ($\approx 10^{20}/cm^3$) by ion implantation (e.g., using phosphorous, arsenic, or antimony), and the ions are then activated through rapid thermal annealing (e.g., at 1000 degrees Celsius for 10 seconds).

Lithography is then used to etch the emitter and collector electrodes 34 and 36 in the upper silicon layer. This etching produces planar common portions 34a and 36a (e.g., approximately rectangular cuboid-shaped) of the electrodes connected by a series of parallel hourglass-shaped lines representing the tips. FIGS. 5A-5D show scanning electron microscopy (SEM) images of a portion of the tip formation process.

In this embodiment, photoresist ashing is used to reduce the line width of the lines. For each emitter-collector tip pair, a photoresist line that is fanned out at both ends is defined (e.g., by 193 nm KrF stepper). A line of photoresist (e.g., with a width of about 180 nm) is deposited on the silicon that connects the planar common portions 34a and 36a of first and second electrodes 34 and 36. This technique of photoresist thinning (or trimming) allows the separation distance between the resulting emitter and collector tips to be less than the lithography limit. This separation distance between the tips (i.e., minimum distance between the electrodes) can be varied through the layout and the ashing conditions. In alternative embodiments, photoresist ashing is not used.

In this exemplary process, the upper silicon layer is etched and then the photoresist is removed. Thermal oxidation is then performed until the center region of hourglass shaped silicon lines is fully consumed into silicon dioxide. The initial line width is reduced by oxygen plasma treatment until the line is broken to form two electrode tips separated by a gap (e.g., of 150 nm).

In this embodiment, the insulated gate material is then deposited between the tips, and lithography is used to pattern a planar gate 38 with apertures to admit and control transport of charged particles (mostly electrons). In further embodiments, the gate is outlined along the circumference of the center region of the hourglass shaped silicon lines that previously suffered thermal oxidation, resulting in a cylindrical gate with apertures. The gate material of this embodiment is degeneratively doped polysilicon (e.g., doped with an element such as P, As, Sb, B, Al, Ga, In, or at least one metal, at a dopant concentration of $\approx 10^{20}/cm^3$). In alternative embodiments, the gate is pure metal, such as tungsten, tantalum, titanium, tantalum-nitride, titanium-nitride, aluminum, cobalt, or nickel. In other alternative embodiments, the gate is thin metal inserted degeneratively doped semiconductor. After the gate is patterned, the remaining silicon dioxide is then selectively removed. The resulting vacuum channel transistor has an emitter electrode 34 with multiple emitter tips 34b, and a collector electrode 36 with corresponding collector tips 36b. The gate 38 has a gate aperture 38a passing through the gate for each emitter-collector tip pair, such that the gate surrounds the end portion of each tip.

The geometrical characteristics of the tips, such as aperture and radius, influence the performance and reliability. In this embodiment, the electrode tips are shaped as a cusp with a rounded cusp apex oriented toward the gate. The cusp apex is rounded and convex in order to limit cusp breakdown at or near the cusp apex. These softened convex tips are formed by using thermal reflow of the photoresist to soften and round each needle-like apex. The photoresist is reflowed (e.g., at 160 degrees Celsius for 60 seconds) and then the upper silicon is etched to form the emitter and collector tips 34b and 36b of the transistor. This produces a rounded tip (e.g., with a 14 nm radius of curvature). In another embodiment, the electrodes have sharp concave tips and are formed of a material that is reinforced to withstand high thermal and mechanical stresses.

Thus, there is produced a vacuum channel transistor having an emitter electrode with N emitter tips that each have a corresponding symmetrical collector tip on a collector electrode. The illustrated example shows this nanoscale, gate-insulated, planar, lateral triode with five emitter-collector tip pairs, but any number of pairs can be provided to increase the current. For example, 100 emitter tips tied to a single common emitter pad result in an approximately 100 times greater drive current than a transistor having only a single emitter-collector tip pair. From an area perspective, in this example if the emitter tip pitch is assumed to be 100 nm, the total length for 100 emitter tips is 10 μm. This length can be accommodated with a common emitter pad size of 150 μm. The multiple emitter-collector tip transistor can be produced by changing only the layout, without requiring any process change.

Figure 6:
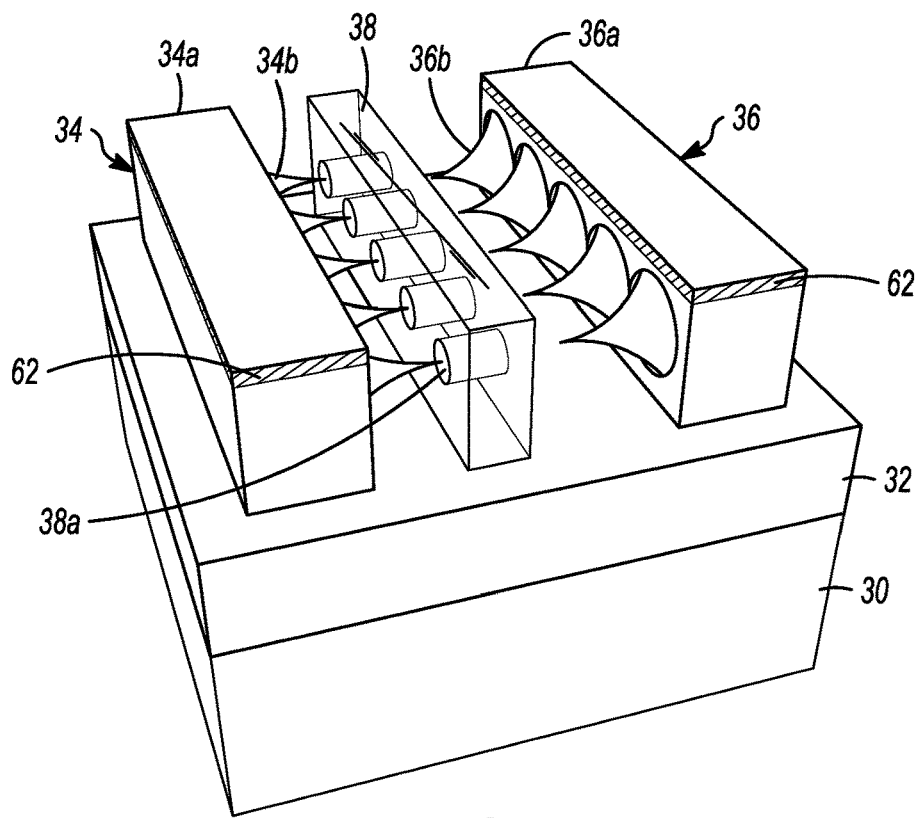
FIG. 6 is a schematic view of a vacuum channel transistor according to another embodiment of the present invention.

FIG. 6 illustrates a vacuum channel transistor according to another embodiment of the present invention. In the embodiment described above, the gate overlaps with both the emitter and collector tips 34b and 36b (and thus a portion of the emitter and collector electrodes). In the alternative embodiment of FIG. 6, the gate overlaps with the emitter tips 34b but does not overlap the collector tips 36b (and thus with only a portion of the emitter electrode). The gate width is reduced to space the gate 38 from the collector electrode 36 so as to create a separation distance between the end of each collector tip 36b and the corresponding gate aperture 38a of the gate 38. In this exemplary embodiment, the gate-to-collector separation distance (gate sidewall nearest collector to collector tip) is from one-fourth to three-fourths of the electrode-electrode separation distance.

The gate controls electron tunneling between the emitter and collector tips and the local electric field. So the placement of the gate relative to the emitter and collector tips is important to the operation of the transistor and its characteristics. While a gate that overlaps the emitter-collector tips is electrostatically advantageous, the collector tip to gate separation distance present in this embodiment reduces the carriers that are intercepted by the gate before they arrive at the collector.

In some embodiments, a layer of metal is deposited on the top of the emitter and/or collector electrode. This metal coating makes the electrode more robust, decreases erosion, and increases lifetime. And the metal coating can also substantially improve the tunneling efficiency and emission efficiency if a low work function metal is used. In one embodiment, a thin metal layer (represented by 62 in FIG. 6) of tungsten or titanium with a thickness of 1-5 nm is deposited on the planar portions 34a and 36a of both electrodes (e.g., by sputtering, chemical vapor deposition (CVD), plasma enhanced chemical vapor deposition, or wet chemistry).

In other embodiments, a layer of metal silicide is formed on the top of the emitter and/or collector electrode. This metal silicide coating makes the electrode more robust and increases lifetime. In one embodiment, a thin metal layer of titanium with a thickness of 1-5 nm is deposited on the planar portions 34a and 36a of both electrodes (e.g., by sputtering, chemical vapor deposition (CVD), plasma enhanced chemical vapor deposition, or wet chemistry). Then an annealing step is performed to convert the metal into a semiconductor-metal alloy (represented by 62 in FIG. 6). The metal silicide layer is kept thin so as not to significantly decrease the emission efficiency of the electrode.

In some embodiments, a very thin (e.g., a few atomic layers thick) dielectric layer is formed on the top of the emitter and/or collector electrode. This very thin dielectric coating acts as a protective layer that protects the underlying silicon electrode structure from rapid wear and deterioration, but is thin enough so as not to significantly decrease the emission efficiency of the electrode. In one embodiment, a one, two, or three atomic layers thick silicon oxide coating (represented by 62 in FIG. 6) is formed on the top of the planar portions 34a and 36a of both electrodes. This provides surface protection without substantially degrading the tunneling efficiency.

In some embodiments, heterogeneous epitaxial growth of multiple layers of semiconductor material (e.g., superlattice) is carried out on the surface of the multiple emitter and/or collector tips, which generates negative work function.

Figure 7:
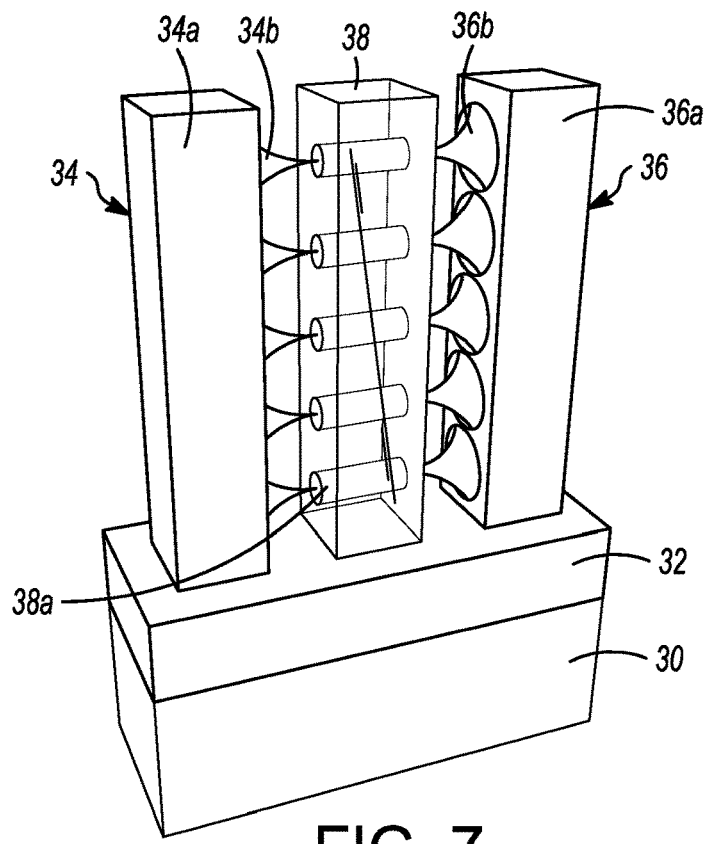
FIG. 7 is a schematic view of a vacuum channel transistor according to yet another embodiment of the present invention.
Figure 8:
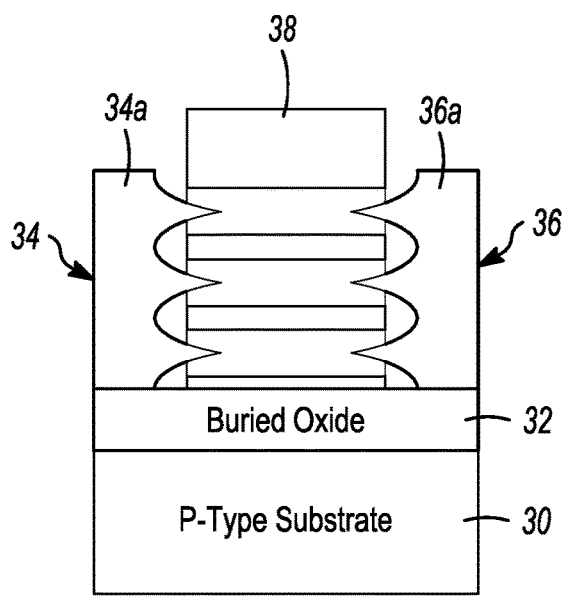
FIG. 8 is a cross-sectional view of the vacuum channel transistor of FIG. 7.
Figure 9:
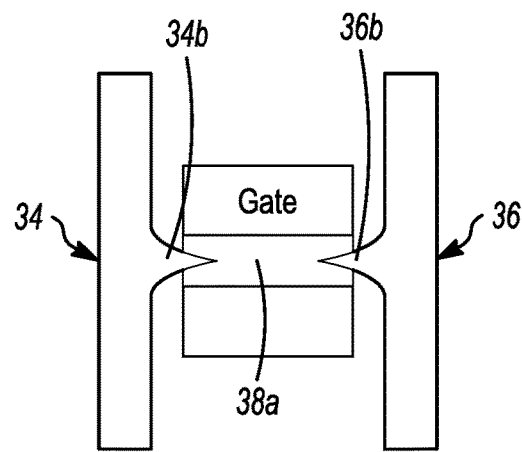
FIG. 9 is a top view of the vacuum channel transistor of FIG. 7.

FIGS. 7-9 illustrate a vacuum channel transistor according to yet another embodiment of the present invention. In the embodiments described above, each emitter-collector tip pair is laid out horizontally, with the multiple emitter-collector tip pairs of the transistor also being laid out horizontally. In the alternative embodiment of FIGS. 7-9, each emitter-collector tip pair is still laid out horizontally, but the multiple emitter-collector tip pairs of the transistor are stacked vertically. In other words, in both types of transistors the two tips of each electrode pair are located across from one another on a horizontal plane (i.e., in the same direction as the substrate). But the two types of transistors differ in how two or more of these horizontal electrodes are combined to form the device. In the transistors of FIGS. 2-4 and 6, the multiple horizontal electrodes are arranged side-by-side (i.e., horizontally-aligned). In the transistor of FIGS. 7-9, the multiple horizontal electrodes are vertically-stacked. That is, instead of the tip pairs being formed side-by-side from a single silicon layer, they are formed on top of each other in a vertical stack (e.g., through the deposition and etching of successive silicon, or other semiconductor, layers). This transistor with N vertically-stacked tip pairs produces substantially the same current flow as the transistor with N horizontally-aligned tip pairs. While the horizontally laid out electrodes are simpler to fabricate, the resulting transistor has a large footprint. In contrast, the device with vertically-stacked horizontal electrodes is more complicated to fabricate, but the resulting transistor has the same footprint as a device with a single pair of tips.

While the embodiment of FIGS. 7-9 has a gate that overlaps with both the emitter and collector tips 34b and 36b, in an alternative embodiment the gate overlaps with the emitter tips 34b but does not overlap the collector tips 36b. As described above with respect to FIG. 6, in this alternative embodiment there is a separation (i.e., distance of separation) between the end of each collector tip 36b and the corresponding gate aperture 38a.

Figure 10:
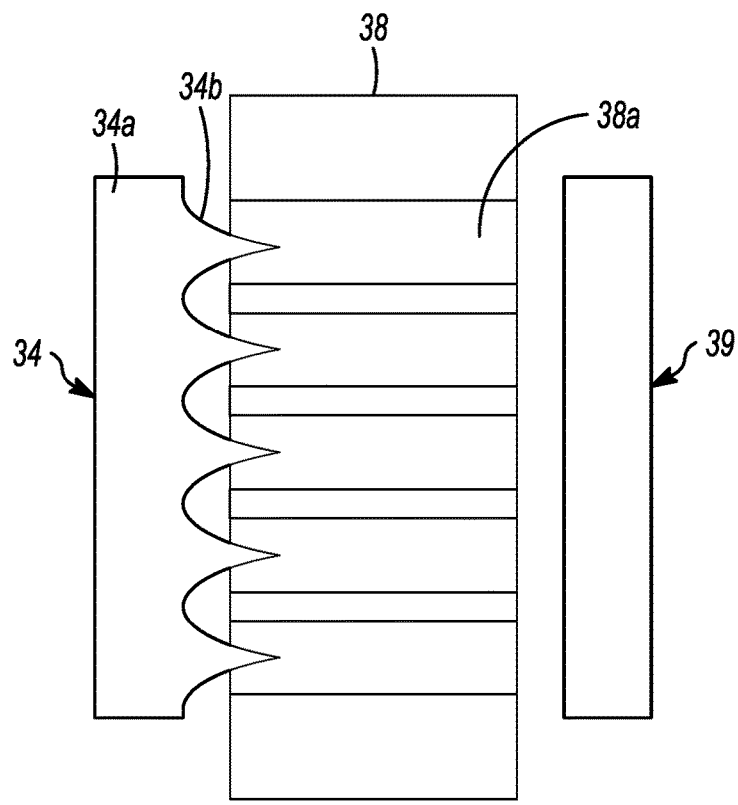
FIG. 10 illustrates a vacuum channel transistor according to another embodiment of the present invention.

FIG. 10 illustrates a vacuum channel transistor according to another embodiment of the present invention. In the embodiments described above, both the emitter electrode and the collector electrode have multiple tips. In the alternative embodiment of FIG. 10, the emitter electrode 34 has multiple emitter tips 34b, but the collector electrode is a single planar surface 39 that collects the current from all of the emitter tips. As in the above embodiments, the emitter electrode has N emitter tips, each with a corresponding gate aperture 38a. But instead of having N collector tips, the collector electrode is a single planar plate-like collector. In addition to the separation distance between the emitter tips and the planar collector electrode (i.e., minimum distance between the electrodes), there is a distance that separates the collector-side end of each gate aperture 38a from the planar collector electrode. In this exemplary embodiment, the gate-to-collector separation distance (gate sidewall nearest collector to collector sidewall nearest gate) is from one-fourth to three-fourths of the electrode-electrode separation distance.

The single planar collector of this embodiment increases the collection of injected carriers and reduces their loss. The electrodes of this embodiment can be laid out horizontally or vertically, with FIG. 10 representing either a top view of a transistor with N horizontally laid out emitter tips or a cross-sectional view of a transistor with N vertically-stacked emitter tips.

During operation, the carrier transport of solid-state transistors is dominated by a drift-diffusion mechanism. In contrast, the vacuum channel transistors of the present invention rely on Fowler-Nordheim emission and quantum tunneling. The emitter and collector electrodes are provided with a voltage difference (e.g., of not more than about 10 volts), and the gate is provided with a controllably variable gate voltage (e.g., varied between $V_{min}<2$ volts and $V_{max}>2$ volts, relative to the emitter electrode). The turn-on voltage is the voltage value required to provide an electrical field of 1 volt/μm adjacent to the electrode tips. When this gate voltage is less than the turn-on voltage (e.g., 2 volts), a few electrons are emitted over the barrier with approximately thermal energy, but the current is limited because the electrons surmounting the barrier are fewer than the electrons at ground level. When the gate voltage is increased to above the turn-on voltage, the vacuum energy curve bends downward so as to allow electron tunneling through the narrow nominal barrier, which leads to the on-state of the device.

No electrons are emitted from the emitter until the $V_c$ reaches the turn-on voltage, and $I_c$ increases exponentially with respect to $V_c$, according to Fowler-Nordheim tunneling theory. At a given gate voltage $V_g$, the collector voltage $V_c$ triggers the field-emitted current $I_c$. The threshold voltage is about 8.9 volts and the on/off current ratio is on the order of $10^6$. The drive current is on the order of 10 μA per emitter tip, and the collector leakage current is on the order of 10 pA per emitter tip. The gate leakage current ($I_g$) is negligible due to the gate insulator. Because of the ballistic transport in vacuum, the frequency response is only limited by the transconductance and the input capacitance.

In some embodiments, the emitter and collector electrodes are made of different materials and/or have different doping types, so as to allow tunneling from the emitter to the channel but to suppress undesired tunneling from the collector to the channel. In one such embodiment, the emitter electrode is made of one of silicon, germanium, an Si—Ge alloy, a III-V compound (such as GaAs or InP), SiC, GaN, AN, GaO, diamond, carbon nanotube, graphene, and a metal or metal alloy (such as aluminum, copper, tungsten, or titanium), while the collector electrode is made of a different material from that group. In another such embodiment, the emitter electrode is doped one type (e.g., N-type), while the collector electrode is doped the opposite type (e.g., P-type).

Accordingly, embodiments of the present invention provide an air transistor with multiple horizontally laid out or vertically stacked emitter tips attached to a single emitter electrode. The transistor can be fabricated using standard silicon semiconductor processing. The emitter and collector can be sub-lithographically separated through photoresist ashing, with the curvature of the tips controlled by thermal reflow of the photoresist. As long as there is a nanoscale gap separating the emitter and collector tips (e.g., of less than 180 nm, 150 nm, 100 nm, or 50 nm, or less than the electron mean free path in air), vacuum is not needed. The present structure exhibits superior gate controllability and negligible gate leakage current due to the gate insulator. The device is particularly suited for high performance and high current/power applications. Because vacuum, as a carrier transport medium, is immune to high temperature and to radiation, the disclosed nano-transistors are ideal for extreme environment applications in military and space.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A vacuum channel transistor comprising:
a substrate comprising a layer of semiconductor material;
a horizontal emitter electrode formed in the layer of semiconductor material, the emitter electrode including a plurality of horizontally-aligned emitter tips connected to a planar common portion;
a first layer of material deposited on the planar common portion of the emitter electrode, the first layer of material enhancing tunneling and emission efficiency;
a horizontal collector electrode formed in the layer of semiconductor material, the collector electrode including a planar portion, and a minimum distance between the emitter and collector electrodes being less than about 180 nm;
a second layer of material deposited on the planar portion of the collector electrode, the second layer of material enhancing tunneling and emission efficiency; and
a horizontal insulated gate located between the emitter electrode and the collector electrode, the gate including a plurality of horizontally-aligned gate apertures passing through the gate, wherein each aperture corresponds to one of the emitter tips of the emitter electrode.

2. The vacuum channel transistor of claim 1, wherein the collector electrode also includes a plurality of horizontally-aligned collector tips connected to the planar portion of the collector electrode, each of the collector tips corresponding to one of the emitter tips.

3. The vacuum channel transistor of claim 2, wherein the gate overlaps portions of the emitter and collector electrodes such that each gate aperture surrounds a portion of its corresponding emitter tip and a portion of its corresponding collector tip.

4. The vacuum channel transistor of claim 2, wherein the gate overlaps a portion of the emitter electrode such that each gate aperture surrounds a portion of its corresponding emitter tip, but does not overlap any portion of the collector electrode such that each gate aperture is separated from its corresponding collector tip.

5. The vacuum channel transistor of claim 1, wherein the collector electrode only has the planar portion and does not include any collector tips.

6. The vacuum channel transistor of claim 5, wherein the gate overlaps a portion of the emitter electrode such that each gate aperture surrounds a portion of its corresponding emitter tip, but is separated from the collector electrode.

7. The vacuum channel transistor of claim 1, wherein the minimum distance between the emitter and collector electrodes is less than about 150 nm.

8. The vacuum channel transistor of claim 1, wherein the substrate is a silicon-on-insulator substrate comprising:
a lower substrate layer;
the layer of semiconductor material, which comprises silicon; and
a buried oxide layer located between the lower substrate layer and the layer of semiconductor material.

9. The vacuum channel transistor of claim 1 wherein the first layer of material is a metal.

10. The vacuum channel transistor of claim 9 wherein the metal is chosen from the group consisting of tungsten and titanium.

11. The vacuum channel transistor of claim 1 wherein the first layer of material includes a layer of metal silicide.

12. The vacuum channel transistor of claim 1 wherein the second layer of material is a metal.

13. The vacuum channel transistor of claim 12 wherein the metal is chosen from the group consisting of tungsten and titanium.

14. The vacuum channel transistor of claim 1 wherein the second layer of material includes a layer of metal silicide.

15. A vacuum channel transistor comprising:
an emitter electrode formed of a first semiconductor material, the emitter electrode including a plurality of vertically-stacked emitter tips connected to a planar common portion;
a collector electrode formed of second semiconductor material, the collector electrode including a planar portion, and a minimum distance between the emitter and collector electrodes being less than about 180 nm; and an insulated gate located between the emitter and collector electrodes, the gate including a plurality of vertically-stacked gate apertures passing through the gate that each correspond to one of the emitter tips of the emitter electrode.

16. The vacuum channel transistor of claim 15, wherein the collector electrode also includes a plurality of vertically-stacked collector tips connected to the planar portion of the collector electrode, each of the collector tips corresponding to one of the emitter tips.

17. The vacuum channel transistor of claim 16, wherein the gate overlaps portions of the emitter and collector electrodes such that each gate aperture surrounds a portion of its corresponding emitter tip and a portion of its corresponding collector tip.

18. The vacuum channel transistor of claim 16, wherein the gate overlaps a portion of the emitter electrode such that each gate aperture surrounds a portion of its corresponding emitter tip, but does not overlap any portion of the collector electrode such that each gate aperture is separated from its corresponding collector tip.

19. The vacuum channel transistor of claim 15,
wherein the collector electrode only has the planar portion and does not include any collector tips, and the gate overlaps a portion of the emitter electrode such that each gate aperture surrounds a portion of its corresponding emitter tip, but is separated from the collector electrode.

\* \* \* \* \*